(12) United States Patent
Levy et al.

(10) Patent No.: US 9,997,245 B1
(45) Date of Patent: *Jun. 12, 2018

(54) METHOD AND APPARATUS FOR TCAM BASED LOOK-UP

(71) Applicant: Marvell Israel (M.I.S.L) Ltd., Yokneam (IL)

(72) Inventors: Gil Levy, Hod Hasharon (IL); Carmi Arad, Nofit (IL)

(73) Assignee: Marvell Israel (M.I.S.L) Ltd., Yokneam (IL)

( * ) Notice: Subject to any disclaimer, the term of this patent is extended or adjusted under 35 U.S.C. 154(b) by 0 days. days.

This patent is subject to a terminal disclaimer.

(21) Appl. No.: 15/018,096

(22) Filed: Feb. 8, 2016

Related U.S. Application Data

(63) Continuation of application No. 13/966,962, filed on Aug. 14, 2013, now Pat. No. 9,269,439.

(60) Provisional application No. 61/695,520, filed on Aug. 31, 2012.

(51) Int. Cl.
*G06F 12/00* (2006.01)
*G11C 15/04* (2006.01)
*G06F 3/06* (2006.01)

(52) U.S. Cl.
CPC ............ *G11C 15/04* (2013.01); *G06F 3/0604* (2013.01); *G06F 3/0629* (2013.01); *G06F 3/0673* (2013.01)

(58) Field of Classification Search
None
See application file for complete search history.

(56) References Cited

U.S. PATENT DOCUMENTS

| | | |
|---|---|---|
| 6,362,992 B1 | 3/2002 | Cheng |
| 6,665,297 B1 | 12/2003 | Hariguchi |
| 7,213,111 B1 | 5/2007 | Kao |
| 7,461,200 B1 | 12/2008 | Birman |
| 7,707,217 B2 | 4/2010 | Allwright |
| 2003/0233516 A1 | 12/2003 | Davis |
| 2005/0262294 A1 | 11/2005 | Bitar |
| 2006/0221990 A1 | 10/2006 | Muller |
| 2013/0031077 A1 | 1/2013 | Liu et al. |
| 2014/0244815 A1 | 8/2014 | Bhardwaj |
| 2015/0039823 A1 | 2/2015 | Chen |
| 2015/0067313 A1* | 3/2015 | Zaidi ................ G06F 21/572 713/2 |

* cited by examiner

*Primary Examiner* — Baboucarr Faal

(57) ABSTRACT

Aspects of the disclosure provide an electronic device that includes an exact match engine, a ternary content addressable memory (TCAM) engine, a search key generator and an output module. The exact match engine is configured to store a first set of entries. The TCAM engine is configured to store a second set of entries including at least some entries that are different from entries of the first set of entries. The search key generator is configured to generate a search key and provide the search key to the exact match engine and to the TCAM engine. The output module is configured to select one of a first output from the exact match engine and a second output from the TCAM engine in response to a signal that indicates whether the search key exactly matches one of the first set of entries.

19 Claims, 6 Drawing Sheets

METHOD AND APPARATUS FOR TCAM BASED LOOK-UP

INCORPORATION BY REFERENCE

This present disclosure is a continuation of U.S. application Ser. No. 13/966,962, filed on Aug. 14, 2013, which claims the benefit of U.S. Provisional Application No. 61/695,520, "EFFICIENT TCAM ARCHITECTURE" filed on Aug. 31, 2012. The disclosures of the applications referenced above are incorporated herein by reference in their entireties.

BACKGROUND

The background description provided herein is for the purpose of generally presenting the context of the disclosure. Work of the presently named inventors, to the extent the work is described in this background section, as well as aspects of the description that may not otherwise qualify as prior art at the time of filing, are neither expressly nor impliedly admitted as prior art against the present disclosure.

Generally, content addressable memory (CAM) is used in various applications to provide a relatively fast searching capability. In an example, a network device, such as a network switch, a router and the like includes a ternary CAM (TCAM) to store criteria for a plurality of switching rules. In an example, a criterion includes a range requirement that occupies one or more TCAM entries, and addresses of the TCAM entries point to action codes associated with the criterion. When the network device receives a packet, attributes of the packet are extracted to form a search key. The search key is compared with plural TCAM entries, typically comparison of the search key against the plural TCAM entries is performed in a single clock cycle, to find a matching entry from among the TCAM entries. The address of the matching entry points to an action code. According to the action code, the network device takes specified actions on the packet.

SUMMARY

Aspects of the disclosure provide an electronic device that includes an exact match engine, a ternary content addressable memory (TCAM) engine, a search key generator and an output module. The exact match engine is configured to store a first set of entries. The TCAM engine is configured to store a second set of entries including at least some entries that are different from entries of the first set of entries. The search key generator is configured to generate a search key and provide the search key to the exact match engine and to the TCAM engine. The output module is configured to select one of a first output from the exact match engine and a second output from the TCAM engine in response to a signal that indicates whether the search key exactly matches one of the first set of entries.

According to an aspect of the disclosure, the exact match engine and the TCAM engine operate in parallel in response to the search key.

In an embodiment, the exact match engine is configured to store the first set of entries, where at least some entries among the first set of entries are of a different size than other entries. Further, the electronic device includes a masking circuit configured to combine the search key with a mask template to generate a masked search key of a specific size. Then, the exact match engine is configured to search an entry with which the masked search key matches exactly.

According to an aspect of the disclosure, the electronic device includes a controller configured to cause a range to be expanded into entries in a binary aligned form and cause the entries to be respectively stored in one of the exact match engine and the TCAM engine. In an example, the controller is configured to cause the entries to be respectively stored in one of the exact match engine and the TCAM engine as a function of which requires lesser silicon area for storage of the respective entry.

In an embodiment, the exact match engine includes static random access memory (SRAM) that is accessed based on a hash look-up of the search key.

Aspects of the disclosure provide a method. The method includes storing a first set of entries by an exact match engine, storing a second set of entries by a ternary content addressable memory (TCAM) engine, generating a search key, matching the search key to the first set of entries by the exact match engine to generate a first output, matching the search key to the second set of entries by the TCAM engine to generate a second output, and selecting one of the first output and the second output in response to a signal that indicates whether the search key exactly matches one of the first set of entries.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION OF EMBODIMENTS

Figure 1:
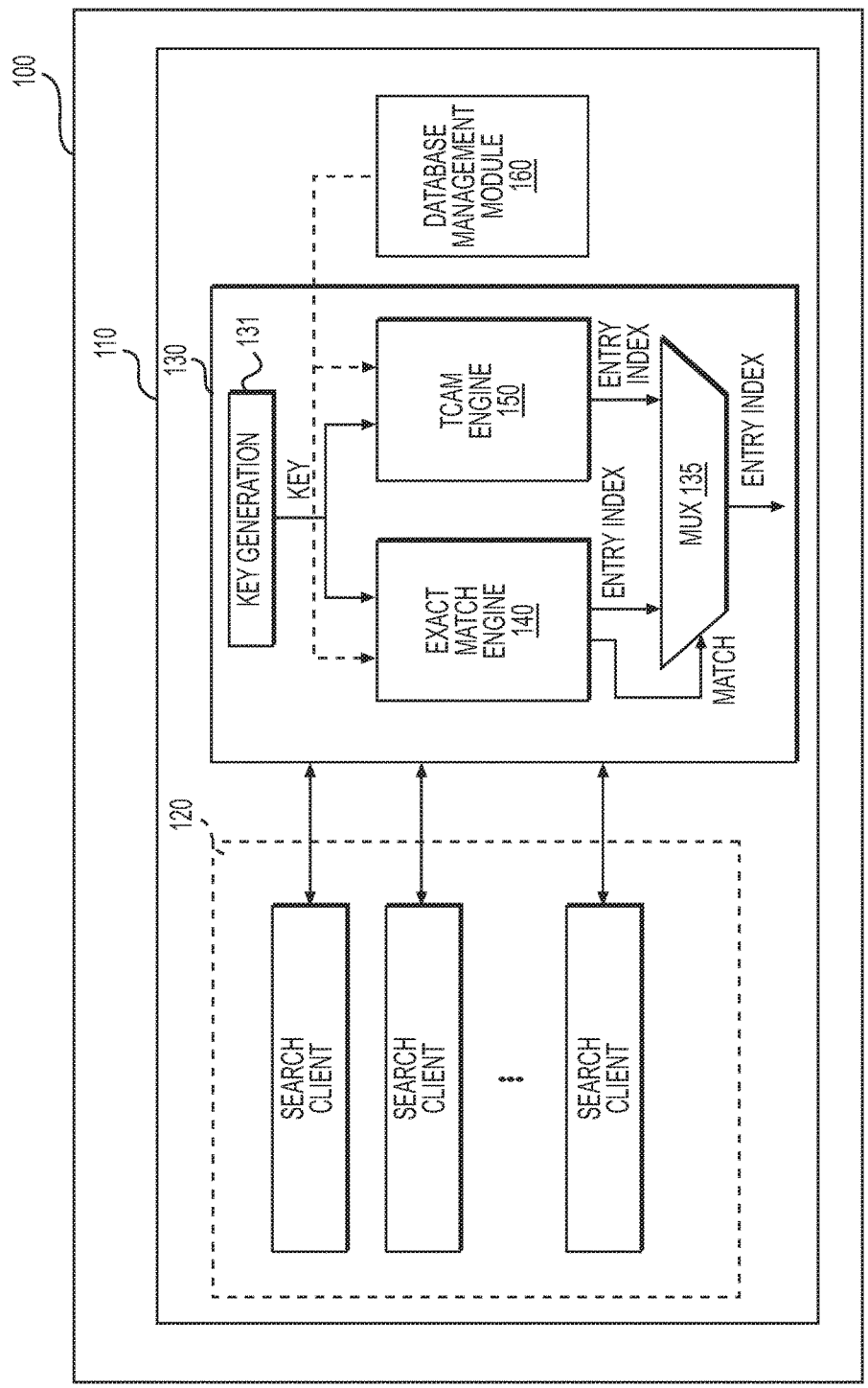
FIG. 1 shows a block diagram of an electronic device 100 according to an embodiment of the disclosure.

FIG. 1 shows a block diagram of an electronic device example 100 according to an embodiment of the disclosure. The electronic device 100 includes a search engine 130 having an exact match engine 140 and a ternary content addressable memory (TCAM) engine 150. In an embodiment, the exact match engine 140 and the TCAM engine 150 operate in parallel, for example generally in the same search cycle based on a system clock, in response to a search key. The exact match engine 140 determines whether an entry in the exact match engine 140 matches the search key exactly, and outputs a signal to indicate whether there is an exact match or a search fail and an entry index when the exact match happens, and the TCAM engine 150 outputs an entry index of an entry in the TCAM engine 150 that is inclusive of the search key. The search engine 130 outputs one of the entry indexes from the exact match engine 140 and the TCAM engine 150 based on the signal that indicates whether there is a match or a search fail.

The electronic device 100 can be any suitable device that uses a search engine to match a search key to stored data patterns. In the FIG. 1 example, the electronic device 100 is a network device 100, such as a network switch, a router, and the like. The network device 100 includes a packet processor 110 configured to process packets, in an embodiment. For example, the network device 100 receives incoming packets from other devices via ingress ports, and the packet processor 110 processes the packets, and determines actions on the packets, such as forwarding a packet to one or more egress ports to output the packet, filtering a packet, statistics gathering for network management/security and the like based on attributes of the packets.

According to an aspect of the disclosure, the network processor 110 determines actions on packets based rules. In an embodiment, a rule includes criteria and an action code associated with the criteria. The criteria specify data patterns for attributes. In an example, the data patterns include range requirement and/or exact match requirement. In an example, a switching rule is expressed in plain English as "permit forwarding a packet with source address 172.15.5.0/24, TCP port number between 1 to 14". The switching rule includes a source address criterion, a protocol (TCP) criterion, a TCP port number criterion, and an action code "permit forwarding" in association with the criteria. When a received packet satisfies the criteria, an action according to the action code can be taken on the received packet.

In the FIG. 1 example, the packet processor 110 includes a processing circuit 120 and the search engine 130 coupled together. In an embodiment, the processing circuit 120 includes a plurality of search clients that require search service from the search engine 130. In an example, the search clients are packet processing stages, and one or more packet processing stages are coupled with the search engine 130 to determine an action code for a packet.

In an example, a packet includes a header of 128 bytes. The packet processing stages respectively parse a portion of the header. Then, the search engine 130 respectively searches for action codes based on the parsed portions of the header. The search results can be suitably combined to determine a suitable action code for the packet.

According to an aspect of the disclosure, criteria are stored in the search engine 130, and the action codes are stored separately from the criteria. In an embodiment, the criteria are stored in the search engine 130 as entries that are indexed and the action codes are stored in a memory (not shown) at address that are pointed by indexes of the entries. In an example, the index of an entry points to an address in the memory that stores an action code associated with the criteria.

When a packet is received, a search key is generated based on the packet. The search engine 130 finds an entry that the search key matches the criteria of the entry. Then, based on the entry index, an action code associated with the criteria is retrieved. According to the action code, suitable action is then taken on the received packet.

Various criteria are stored in the search engine 130. The exact match engine 140 and the TCAM engine 150 in the search engine 130 store criteria using different techniques, and each achieves certain advantages for certain criteria compared to the other.

In an example, the TCAM engine 150 includes TCAM blocks and auxiliary circuits, such as a priority encoder, and the like. Each TCAM block includes a plurality of TCAM entries. A TCAM entry includes a plurality of TCAM cells that each is configured to store ternary states, and thus each TCAM entry is able to store a range requirement representable in a binary aligned form. For example, [16, 31] is represented in the binary aligned form as "01XXXX", where "X" represents a mask that matches both binary "0" and binary "1". Thus, [16, 31] is storable in a single entry of the TCAM engine 150. In another example, [32, 32] is an exact match requirement, and is also representable in the binary aligned form as "100000", thus [32, 32] is storable in a single entry of the TCAM engine 150. In another example, [16, 32] is expandable as a combination of [16, 31] and [32, 32] that are represented in the binary aligned form as "01XXXX" and "100000", thus the TCAM engine 150 needs to use two entries to store [16, 32].

Further, in an embodiment, the exact match engine 140 uses static random access memory (SRAM) to store the criteria (exact match requirements) and uses hash based look-up to search for an exact match, such as disclosed in Applicant's co-pending application Ser. No. 13/737,608, filed Jan. 9, 2013, which is incorporated herein by reference in its entirety. In an example, an SRAM entry in the exact match engine 140 includes a plurality of SRAM cells that each is configured to store binary states, and thus each SRAM entry is able to store one exact match requirement. Further, in an embodiment, a range requirement is expanded into a combination of a plurality of exact match requirement, and then needs a plurality of SRAM entries to store. For example, [16, 31] is stored in the exact match engine 140 using 16 entries that each stores a value in the range, and [32, 32] is stored in the exact match engine 140 using one entry.

According to an aspect of the disclosure, an entry in the exact match engine 140 occupies less silicon area than an entry in the TCAM engine 150. In addition, the exact match engine 140 does not require a priority encoder, which further reduces silicon area per entry. In an example, accumulatively, an average area ratio for a TCAM entry and a SRAM entry is 8:1.

According to another aspect of the disclosure, the exact match engine 140 consumes considerably less power than the TCAM engine 150 during operation because a search in the TCAM engine 150 simultaneously looks for a match against all entries of the TCAM array.

Accordingly, in an embodiment, criteria of rules are selectively stored in the exact match engine 140 and the TCAM engine 150 to achieve certain advantages, such as silicon area reduction, complexity reduction, power reduction and the like. In an example, [16, 31] is selectively stored in the TCAM engine 150 to reduce silicon area consumption for storing the range requirement. In another example, [32, 32] is selectively stored in the exact match engine 140 to reduce silicon area consumption for storing the exact match requirement. In another example, [16, 32] is expanded into [16, 31] and [32,32] which are respectively stored in the TCAM engine 150 and the exact match engine 140 to reduce a total silicon area consumption for storing the range requirement.

In an embodiment, the packet processor 110 includes a database management module 160 that controls rule storage. In an example, the database management module 160 selectively stores rules respectively into the exact match engine 140 and the TCAM engine 150 to minimize silicon area occupation for the rules. In an example, the database management module 160 is implemented as integrated circuits. In another example, the database management module 160 is implemented as software instructions executed by a processor. It is also noted that, in another embodiment, the database management module 160 is external to the electronic device 100, and is coupled to the electronic device 100 at a configuration time to control rule storage.

According to an embodiment of the disclosure, the electronic device 100 is a network switch, such as a software defined network (SDN) switch or an open flow (OF) switch. In an example, the SDN switch/OF switch stores switch specifications in the search engine 130. The architecture of the search engine 130 enables the search engine 130 to have a relatively large rule storage capability to area-efficiently store the switch specifications.

According to an aspect of the disclosure, the exact match engine 140 and the TCAM engine 150 are configured to operate in parallel. In the FIG. 1 example, the search engine 130 includes a key generation module 131, the exact match engine 140, the TCAM engine 150 and a multiplexer module 135. These elements are coupled together as shown in FIG. 1.

In an example, the key generation module 131 generates a search key based on attributes of a packet. In an example, the search key is generated by parsing the packet header. The search key is provided to both the exact match engine 140 and the TCAM engine 150. The exact match engine 140 and the TCAM engine 150 respectively search for entries that match the search key. In an example, the exact match engine 140 and the TCAM engine 150 start the search at about the same time and generate outputs using the same number of clock cycles, such as a single clock cycle.

Specifically, in an embodiment, when the search key matches an exact match requirement stored in an entry of the exact match engine 140, the exact match engine 140 outputs a match signal indicative of a match success, and outputs an entry index of the matching entry; and when the search key does not match any exact match requirements stored in the entries of the exact match engine 140, the exact match engine 140 outputs the match signal indicative of no match having been found. For example, the match signal is set to logic "1" to indicate the match success and is set to logic "0" to indicate no match.

Further, when the search key matches a range requirement stored in an entry of the TCAM engine 150, the TCAM engine 150 outputs the entry index of the matching entry. In an example, the TCAM engine 150 includes a default entry with a lowest priority. When the search key does not match any of the other range requirements stored in the TCAM engine 150, the TCAM engine 150 outputs the entry index of the default entry.

The multiplexer module 135 receives outputs from the exact match engine 140 and the TCAM engine 150, and, in an embodiment, selects one of the outputs based on the match signal from the exact match engine 140. In an example, when the match signal is logic "1", the multiplexer module 135 selects the entry index output from the exact match engine 140 as the output of the search engine 130; and when the match signal is logic "0", the multiplexer module 135 selects the entry index output from the TCAM engine 150 as the output of the search engine 130. It is noted that, in an example, the search engine 130 outputs additional information. For example, the search engine 130 outputs a first additional bit flag to indicate whether the output is a valid match output, and a second additional bit flag to indicate which engine (TCAM engine 150 or the exact match engine 140) has the valid match.

According to an aspect of the disclosure, an existing system that uses a TCAM based search engine only can be suitably re-configured according to FIG. 1 to utilize other memories in the electric device, such as SRAM, DRAM and the like, to implement the exact match engine 140 to store exact match based rules. Thus, TCAM entries are saved to store more range requirement based rules. In addition, a user of the electronic device 100 does not need to be aware of the re-configuration. Further, the exact search engine 140 is configured to have about the same search speed as the TCAM engine 150 and operates in parallel with the TCAM engine 150, and thus in an example, the user experience remains the same.

It is noted that, in an embodiment, the exact match engine 140 is implemented using binary content addressable memory (BCAM), or is implemented using a combination of BCAM and SRAM. In another embodiment, the exact match engine 140 is implemented using SRAM. In another embodiment, the exact match engine 140 is implemented using DRAM.

It is also noted that, in an embodiment, the packet processor 110 is implemented using a single integrated circuit (IC) chip. In another embodiment, the packet processor 110 is implemented using multiple IC chips.

According to an embodiment of the disclosure, the exact match engine 140 and the TCAM engine 150 are respectively configured to store entries of different sizes, and the search engine 130 can be suitably modified to enable a look-up of a same search key among entries of different sizes.

Figure 2:
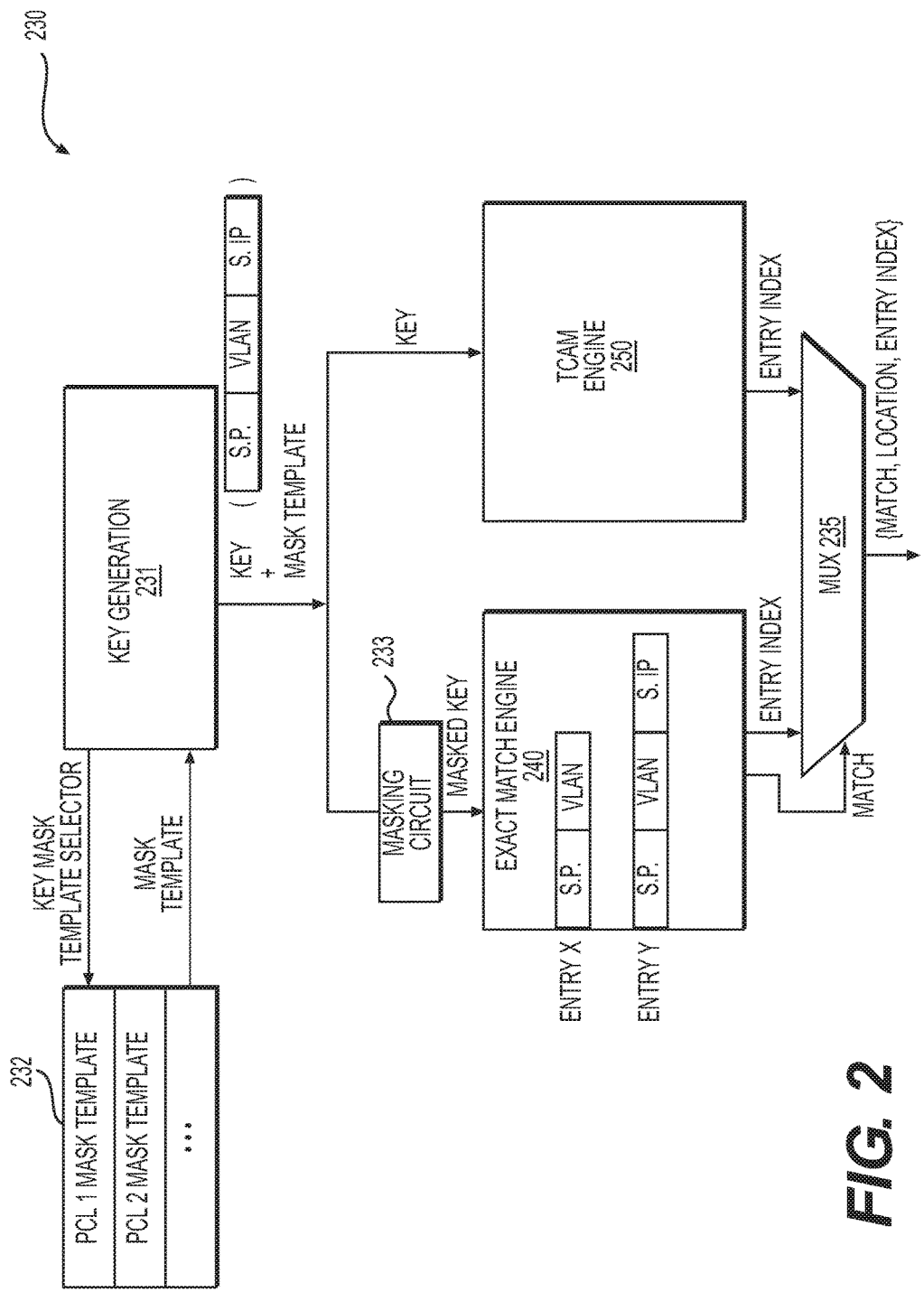
FIG. 2 shows a block diagram of a search engine 230 according to an embodiment of the disclosure.

FIG. 2 shows a block diagram of a search engine 230 according to an embodiment of the disclosure. The search engine 230 utilizes certain components that are identical or equivalent to those used in the search engine 130; the description of these components has been provided above and will be omitted here for clarity purposes. The search engine 230 is configured to store entries of different sizes, and enable simultaneously look-up of a same search key to the entries of different sizes. In the FIG. 2 example, the search engine 230 includes a key generation module 231, a mask template table 232, a masking circuit 233, an exact match engine 240, a TCAM engine 250, and a multiplexer module 235. These elements are coupled together as shown in FIG. 2.

According to an aspect of the disclosure, the exact match engine 240 and the TCAM engine 250 are configured to store entries that may have different sizes. In an example, the TCAM engine 250 includes six TCAM arrays that each is of 8-bit width. When criteria need 16 bits, an entry across two TCAM arrays is used to store the criteria; when criteria need 24 bits, an entry across three TCAM arrays is used to store the criteria; and when criteria need 48 bits, an entry across six TCAM arrays is used to store the criteria. Further, the TCAM engine 250 is configured to search for an entry among entries of different sizes that matches a search key. In an example, the TCAM engine 250 receives a search key and a size for entries, and then searches for an entry of the size and the search key matches the entry.

The exact match engine 240 is also configured to store exact match requirements of different sizes, such as disclosed in Applicant's U.S. Provisional Application No. 61/811,011, filed Apr. 11, 2013, which is incorporated herein by reference in its entirety.

In the FIG. 2 example, the search engine 230 is configured to conduct search based on policy control list (PCL) rules. In an embodiment, PCL rules use criteria of different sizes. In an example, a PCL rule uses first exact match requirements that specify a source port (S.P.) and a virtual local area network (VLAN); and a PCL2 rule uses second exact match requirements that specify a source port (S.P.), a VLAN, and a source IP address (S. IP). The first exact match requirements are stored in entry X of the exact match engine 240, and the second exact match requirements are stored in entry Y of the exact match engine 240.

The key generation module 231 generates a search key based on a packet. In an embodiment of the disclosure, the PCL rules share a same search key. For example, the search key includes values of the source port, the VLAN and the source IP address. Further, the key generation module 231 retrieves a mask template of a suitable PCL rule for the search key. In an example, the key generation module 231 retrieves a key mask template selector of the suitable PCL rule based on the packet. Based on the key mask template selector, a mask template associated with the suitable PCL rule is determined. The key mask template selector can be selected based on various attributes, such as source/destination port, VLAN number, packet protocol (e.g., Ethernet, IP, MPLS, . . . ), service assigned to the packet (e.g., Layer 2 Virtual Private Networks, Pseudo Wire Emulation), user identification, and the like.

In an example, the mask template table 232 stores mask templates associated with PCL rule indexes. For example, the mask template table 232 stores a first mask template associated with PCL1 index and stores a second mask template associated with PCL2 index. The first mask template is configured to keep the source port and the VLAN, and mask the source IP address, and the second mask template is configured to keep the source port, the VLAN and the source IP address.

According to an aspect of the disclosure, the TCAM engine 250 is configured to support entries of different sizes for PCL rules, and to search for an entry among the entries of different sizes based on the same search key. In an embodiment, the TCAM engine 250 is configured to receive the search key and a size of applied PCL rule, and search for an entry having the size and the search key matching the entry.

The masking circuit 233 generates a masked search key based on the search key and the mask template. For example, when the mask template is the first mask template, the masked search key has the source port and VLAN and does not have the source IP address; and when the mask template is the second mask template, the masked search key has the source port, the VLAN and the source IP address. Then, the exact match engine 240 searches for an entry that the masked search key exactly matches to. Thus, in an example, when the masked search key is masked according to the first mask template, the masked search key matches the entry X exactly, and the exact match engine 240 outputs the index of the entry X; and when the masked search key is masked according to the second mask template, the masked search key matches the entry Y exactly, and the exact match engine 240 outputs the index of the entry Y.

The multiplexer module 235 receives outputs from the exact match engine 240 and the TCAM engine 250, and, in an embodiment, selects one of the outputs based on the match signal from the exact match engine 240. In an example, when the match signal is logic "1", the multiplexer module 235 selects the entry index output from the exact match engine 240 as the output of the search engine 230; and when the match signal is logic "0", the multiplexer module 235 selects the entry index output from the TCAM engine 250 as the output of the search engine 230. Further, the search engine 230 outputs a MATCH bit flag to indicate whether the output is a valid match output, and a LOCATION bit flag to indicate which engine (TCAM engine 250 or the exact match engine 240) has the valid match.

It is noted that, in an embodiment of the disclosure, the exact match engine 240 is implemented using on chip SRAM blocks and the TCAM engine 250 is implemented using on chip TCAM blocks. The SRAM blocks and the TCAM blocks can be arranged together according to various architectures.

Figure 3:
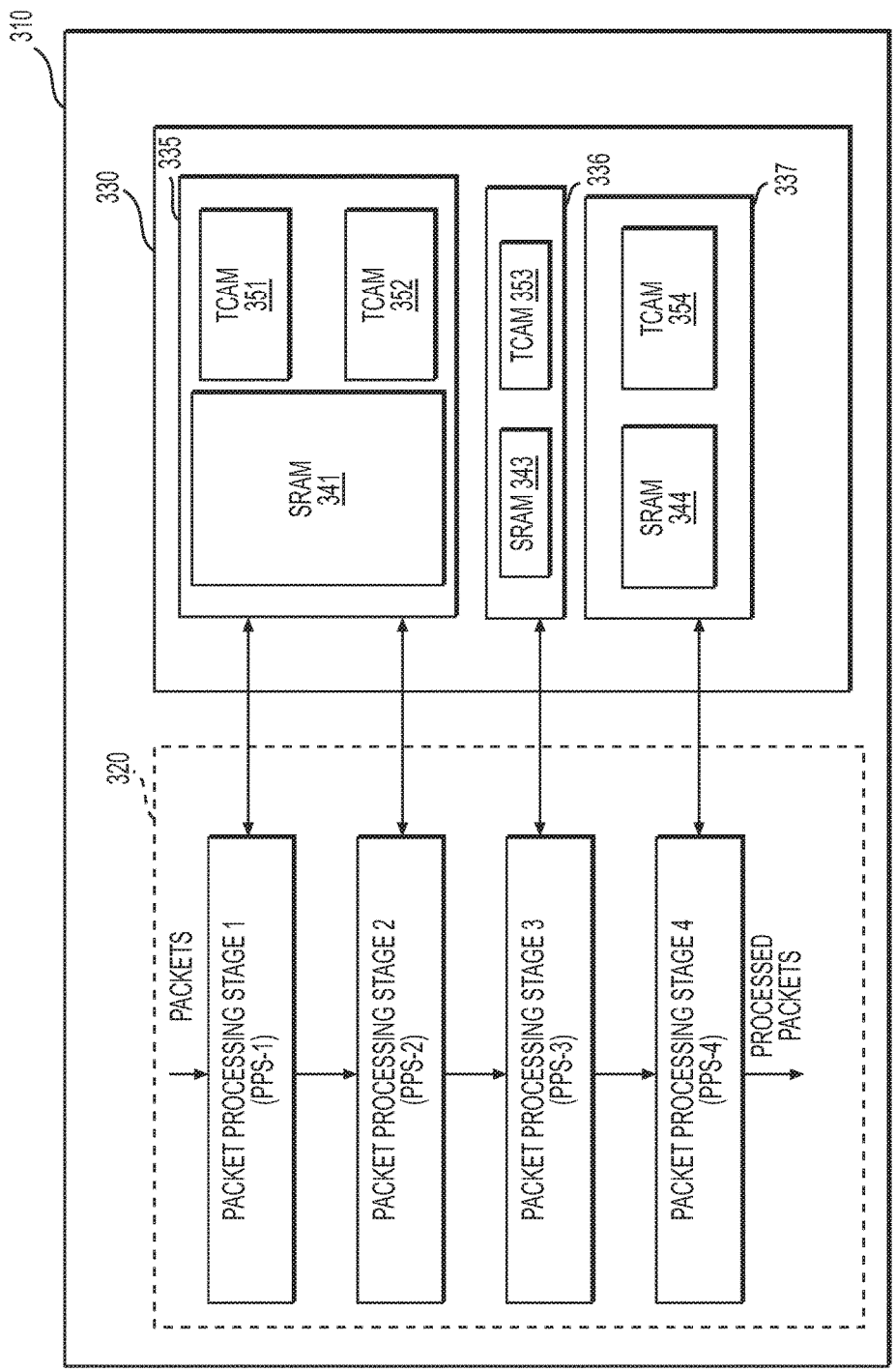
FIG. 3 shows a block diagram of a packet processor 310 according to an embodiment of the disclosure.

FIG. 3 shows a block diagram of a packet processor 310 according to an embodiment of the disclosure. The packet processor 310 includes a packet processing circuit 320, and a search engine 330. The packet processing circuit 320 includes a plurality of search clients, such as a plurality of processing stages PPS-1 to PPS-4.

In the FIG. 3 example, the plurality of processing stages PPS-1 to PPS-4 are coupled together into a processing pipeline architecture. It is noted that the packet processing circuit 320 can have other suitable architecture, such as data flow processor architecture, sea of CPU architecture, and the like.

In an embodiment, each processing stage parses a portion of a packet header to form a search key. For example, the processing stage PPS-1 parses bits 0-31, the processing stage PPS-2 parses bits 32-63, the processing stage PPS-3 parses bits 64-95, and processing stage PPS-4 parses bits 96-127.

According to an aspect of the disclosure, the search engine 330 includes a TCAM engine formed by TCAM blocks 351-354 that are respectively allocated to the processing stages. In an example, the TCAM block 351 is allocated to the processing stage PPS-1 to store range requirements for the bits 0-31; the TCAM block 352 is allocated to the processing stage PPS-2 to store range requirements for the bits 32-63; the TCAM block 353 is allocated to the processing stage PPS-3 to store range requirements for the bits 64-95; and the TCAM block 354 is allocated to the processing stage PPS-4 to store range requirements for the bits 96-127.

According to another aspect of the disclosure, the search engine 330 includes an exact match engine formed by SRAM blocks 341, 343 and 344. In an embodiment, the SRAM blocks can be shared by multiple processing stages to store exact match requirements for the processing stages and can be dedicatedly allocated to a single processing stage to store exact match requirements of the single processing stage. In the FIG. 3 example, the SRAM block 341 is allocated to the processing stages PPS-1 and PPS-2 to store exact match requirements for the processing stages PPS-1 and PPS-2; the SRAM block 343 is allocated to the processing stage PPS-3 to store exact match requirements of the processing stage PPS-3; and the SRAM block 344 is allocated to the processing stage PPS-4 to store exact match requirements of the processing stage PPS-4.

According to an aspect of the disclosure, a combination of an SRAM block and a TCAM block forms a logic TCAM module that operates like the TCAM block from a user experience, but has much higher rule storage capability than the TCAM block.

Figure 4:
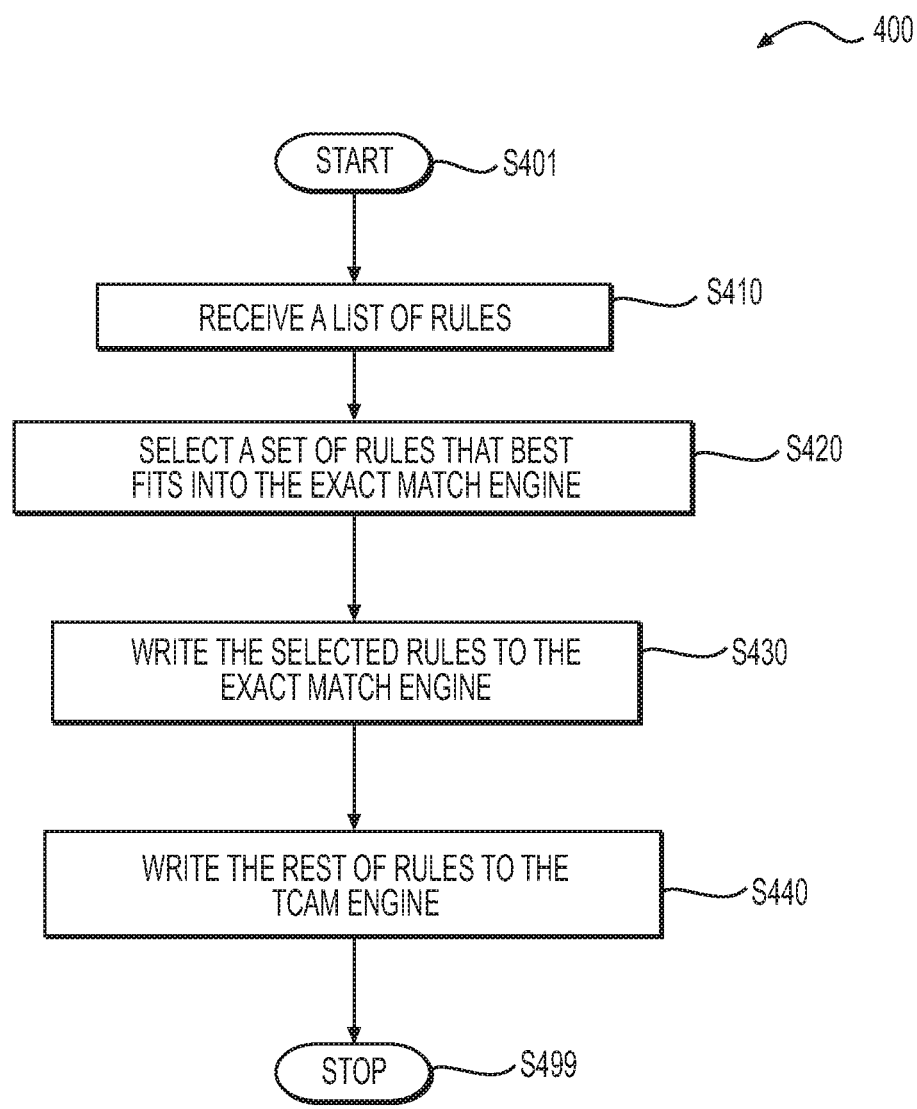
FIG. 4 shows a flow chart outlining a rule storing process 400 according to an embodiment of the disclosure.

FIG. 4 shows a flow chart outlining a process example 400 to selectively store rules respectively into an exact match engine and a TCAM engine according to an embodiment of the disclosure. In an example, the process is executed by the data management module 160 to selectively store rules respectively into the exact match engine 140 and the TCAM engine 150. The process starts at S401 and proceeds to S410.

At S410, a list of rules is received. For example, the data management module 160 receives a list of rules. The rules can be any type of rules, such as protocol classification rules, 5-tuples in state full security systems rules, virtual source interface classification rules, VLAN translations rules, and the like.

At S420, a set of rules that best fits into the exact match engine is selected. For example, the data management module 160 selects a set of rules from the list of rules. The set of rules best fits into the exact match engine 140. In an example, silicon area occupation of the set of rules in the exact match engine 140 is smaller than silicon area occupation of the set of rules in the TCAM engine 150. In an embodiment, the exact match engine is configured to store entries that may have different sizes, such as the exact match engine 240. In this embodiment, the data management module 160 updates mask templates, such as the mask template table 232 and the like, according to the selected set of rules.

At S430, the selected set of rules is written to the exact match engine. For example, the data management module 160 writes the selected set of rules to the exact match engine 140.

At S440, the rest of rules is written to the TCAM engine. For example, the data management module 160 writes the rest of the rules to the TCAM engine 150. Then the process proceeds to S499 and terminates.

It is noted that the above process can be suitable modified. In an example, S440 is executed before S430. In another example, the process is executed for each rule in the list of rules.

Figure 5:
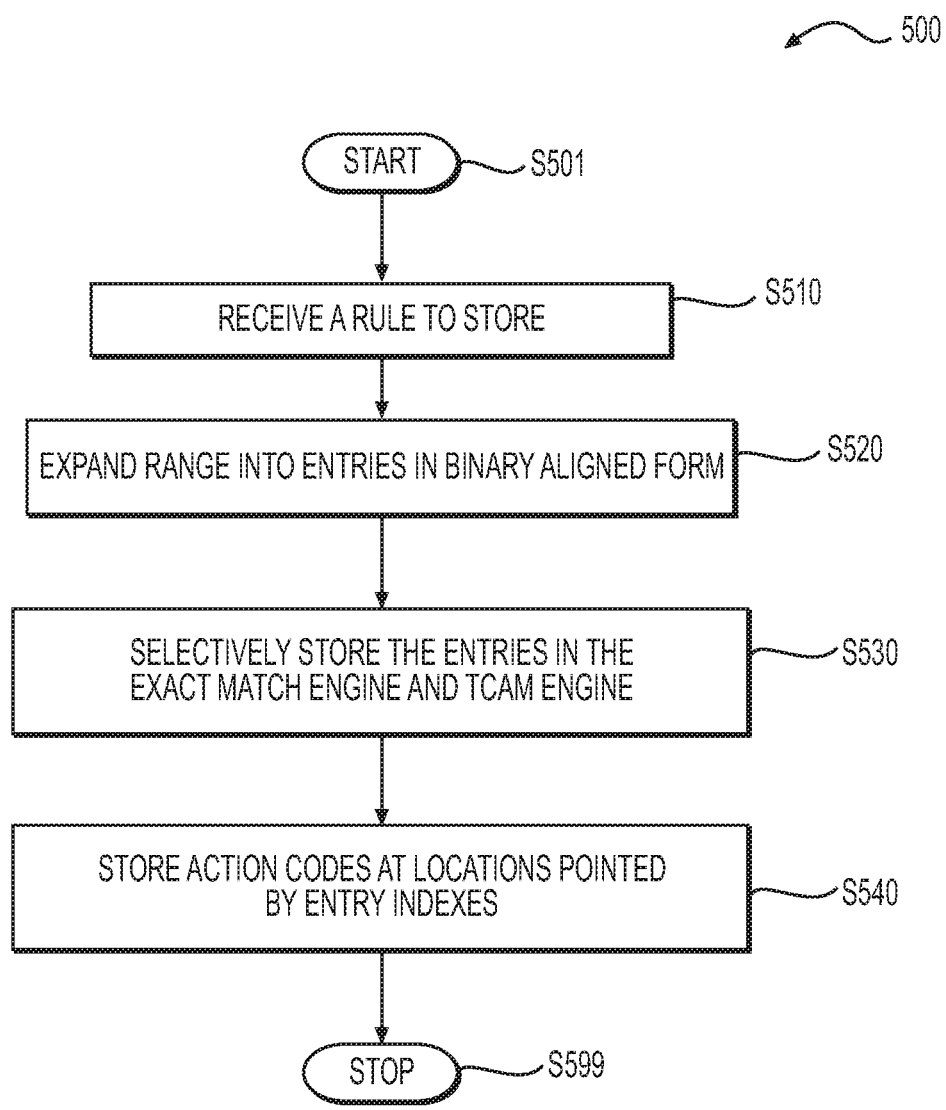
FIG. 5 shows a flow chart outlining another rule storing process 500 according to an embodiment of the disclosure.

FIG. 5 shows a flow chart outlining a process example 500 to store a rule in a search engine according to an embodiment of the disclosure. The rule has a criteria and an action code associated with the criteria. In an embodiment, the search engine 130 includes a controller, such as the data management module 160, and the like, that executes the process 500 to store a rule into the search engine 130. In an example, the controller is implemented as logic circuits to perform the functions; and in another example, the controller is implemented as software codes to be executed by a processor to perform the functions. The process starts at S501, and proceeds to S510.

At S510, the controller receives a rule to store. The rule includes a criteria portion and an action code associated with the criteria portion.

At S520, the controller expands the criteria portion into entries of a binary aligned form. In an example, an entry of the binary aligned form has consecutive mask bits ("X") at the least significant bits, such as "101010", "01000X", "1011XX", "111XXX", "00XXXX", and the like. An entry of the binary aligned form can be stored in a TCAM entry. When the entry does not have any mask bits, such as "101010", the entry is also an exact match entry.

At S530, the controller selectively causes the entries of the binary aligned form to be stored in the exact match engine 140 and the TCAM engine 150. In an example, the controller causes the exact match entries to be stored into the exact match engine 140, and causes the other entries of the binary aligned form to be stored into the TCAM engine 150. In another example, the controller selects one of the TCAM engine 150 and exact match engine 140 to store an entry of the binary aligned form to minimize silicon area consumption. For example, if the area ratio ($\rho$) of a TCAM entry to an exact match entry is larger than two, the controller expands "01000X" into two exact match requirements "010000" and "010001", and stores the two exact match requirements in the exact match engine 140 using two extract match entries. This still minimized area as p is larger than two.

At S540, the controller causes the action code to be stored in a memory at locations that are pointed by the entry indexes. Then the process proceeds to S599 and terminates.

Figure 6:
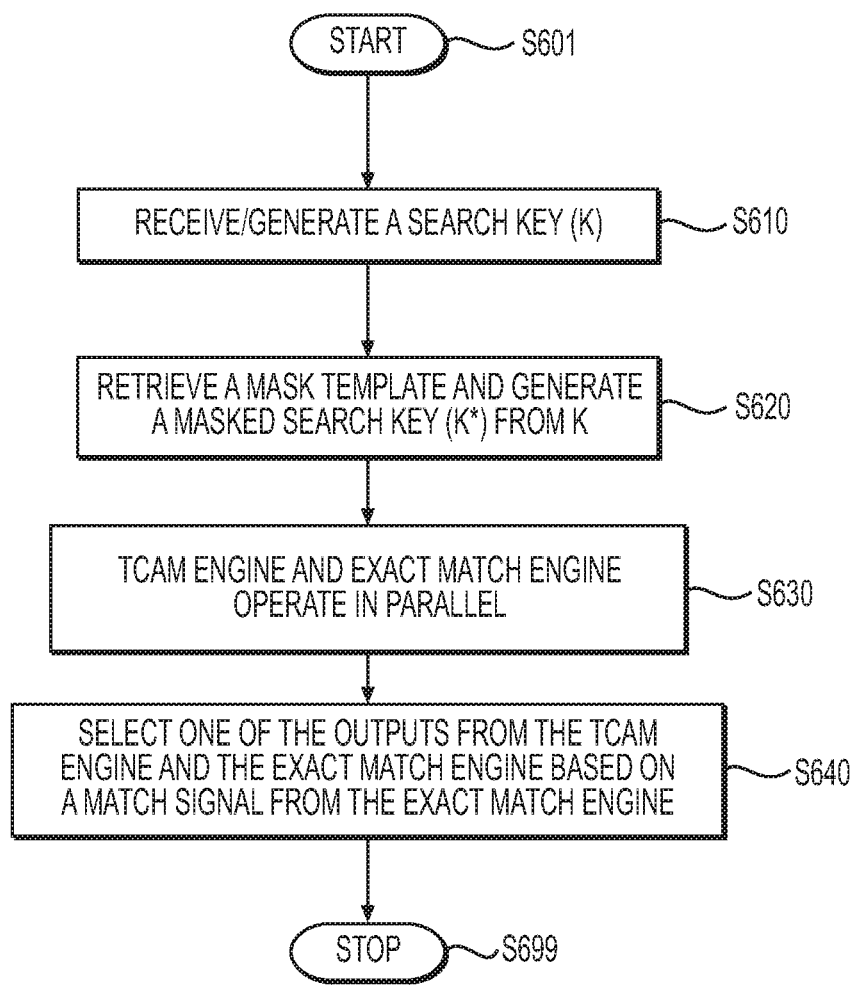
FIG. 6 shows flow chart outlining a searching process 600 according to an embodiment of the disclosure.

FIG. 6 shows a flow chart outlining a process example 600 executed in a search engine, such as the search engine 230, according to an embodiment of the disclosure. The search engine includes an exact match engine and a TCAM engine that are both configured to store entries of different sizes. The process starts at S601 and proceeds to S610.

At S610, the search engine receives or generates a search key (K) based on a packet. In an example, the key generation module 231 parses a portion of the packet header to generate the search key.

At S620, a mask template is retrieved, and a masked search key (K*) is generated. In an example, the packet header is indicative of a rule index for a PCL rule to be applied. Based on the PCL rule index, a mask template is retrieved from the mask template table 232. The mask circuit 233 receives the search key (K) and the mask template and generates the masked search key (K*).

At S630, the TCAM engine and the exact match engine operate in parallel to search for matching entries. In an example, the TCAM engine 250 searches for a matching entry based on the search key (K) and a size of the entry to search. When the search key matches an entry of the size in the TCAM engine 250, the TCAM engine 250 outputs the entry index; otherwise, the TCAM engine 250 outputs an index of a default entry or a signal indicative of "not found" in the TCAM. The exact match engine 240 searches for an exact match of the masked search key (K*). When the masked search key (K*) exactly matches an entry in the exact match engine 240, the exact match engine 240 outputs the match signal indicative of a match success in the exact match engine, and outputs the entry index; otherwise, the exact match engine 240 outputs the match signal indicative of no exact match.

At S640, the search engine selectively outputs a result from the TCAM engine and the exact match engine based on the match signal from the exact match engine. In an example, when the match signal is indicative of a match success in the exact match engine, the multiplexer 235 selects the entry index output from the exact match engine 240 as the search engine output; and when the match signal is indicative of no exact match, the multiplexer 235 selects the entry index output from the TCAM engine 250 as the search engine output. Then the process proceeds to S699 and terminates.

It is noted that the process 600 can be suitably modified. In an example, at S630, the TCAM engine and the exact match engine operate in series to search for matching entries.

While aspects of the present disclosure have been described in conjunction with the specific embodiments thereof that are proposed as examples, alternatives, modifications, and variations to the examples may be made. Accordingly, embodiments as set forth herein are intended to be illustrative and not limiting. There are changes that may be made without departing from the scope of the claims set forth below.

What is claimed is:

1. An electronic device comprising:
    an exact match engine configured to store a first set of entries and provide a match signal to an output circuit;
    a ternary content addressable memory (TCAM) engine configured to store a second set of entries including at least some entries that are different from entries of the first set of entries;
    a search key generator configured to generate a search key and provide the search key to the exact match engine and to the TCAM engine; and the output circuit configured to select one of a first output from the exact match engine and a second output from the TCAM engine, the output circuit being further configured to select always the first output from the exact match engine when the match signal from the exact match engine indicates a valid match, the output circuit being a multiplexer configured to receive (i) the first output from the exact match engine, (ii) the second output from the TCAM engine, and (iii) the match signal from the exact match engine.

2. The electronic device of claim 1, wherein the exact match engine and the TCAM engine operate in parallel in response to the search key.

3. The electronic device of claim 1, wherein the exact match engine is configured to store the first set of entries, where at least some entries among the first set of entries are of a different size than other entries.

4. The electronic device of claim 3, wherein:
a masking circuit is configured to combine the search key with a mask template to generate a masked search key of a specific size; and
the exact match engine is configured to search an entry with which the masked search key matches exactly.

5. The electronic device of claim 1, further comprising:
a controller configured to cause a range to be expanded into entries in a binary aligned form and cause the entries to be respectively stored in one of the exact match engine and the TCAM engine.

6. The electronic device of claim 5, wherein the controller is configured to cause the entries to be respectively stored in one of the exact match engine and the TCAM engine as a function of which requires lesser silicon area for storage of the respective entry.

7. The electronic device of claim 1, wherein the exact match engine includes static random access memory (SRAM) that is accessed based on a hash look-up of the search key.

8. The electronic device of claim 1, wherein the output circuit is further configured to select the second output from the TCAM engine when the exact match engine fails to produce a valid match.

9. A method, comprising:
storing a first set of entries by an exact match engine that provides a match signal to an output circuit;
storing a second set of entries by a ternary content addressable memory (TCAM) engine;
generating a search key;
matching the search key to the first set of entries by the exact match engine to generate a first output;
matching the search key to the second set of entries by the TCAM engine to generate a second output; and
selecting, by the output circuit, one of the first output and the second output, selecting always the first output from the exact match engine when the match signal from the exact match engine indicates a valid match, the output circuit being a multiplexer configured to receive (i) the first output from the exact match engine, (ii) the second output from the TCAM engine, and (iii) the match signal from the exact match engine.

10. The method of claim 9, wherein matching the search key to the first set of entries and matching the search key to the second set of entries are performed in a same search cycle.

11. The method of claim 9, wherein storing the first set of entries by the exact match engine further comprises:
storing the first set of entries in the exact match engine, where at least some entries among the first set of entries are of a different size than other entries.

12. The method of claim 11, further comprising:
combining the search key with a mask template to generate a masked search key of a specific size; and
matching the masked search key of the specific size to the first set of entries of different sizes.

13. The method of claim 9, further comprising:
expanding a range into entries of a binary aligned form; and
selectively storing the entries into one of the exact match engine and the TCAM engine.

14. The method of claim 13, wherein selectively storing the entries into the exact match engine and the TCAM engine further comprises:
selectively storing the entries in one of the exact match engine and the TCAM engine to minimize used silicon area for storing the entries.

15. The method of claim 9, wherein storing the first set of entries by the exact match engine further comprises:
storing the first set of entries in static random access memory (SRAM) that is accessed based on hash look-up of the search key.

16. A network device having a search engine, the search engine comprising:
an exact match engine configured to store a first set of entries and provide a match signal to an output circuit;
a ternary content addressable memory (TCAM) engine configured to store a second set of entries including at least some entries that are different from entries of the first set of entries;
a search key generator configured to generate a search key based on a packet received by the network device and provide the search key to the exact match engine and to the TCAM engine; and
the output circuit configured to select one of a first output from the exact match engine and a second output from the TCAM engine, the output circuit being further configured to select always the first output from the exact match engine when the match signal from the exact match engine indicates a valid match, the output circuit being a multiplexer configured to receive (i) the first output from the exact match engine, (ii) the second output from the TCAM engine, and (iii) the match signal from the exact match engine.

17. The network device of claim 16, wherein the exact match engine and the TCAM engine operate in parallel in response to the search key.

18. The network device of claim 16, wherein the exact match engine is configured to store the first set of entries, where at least some entries among the first set of entries are of a different size than other entries.

19. The network device of claim 16, further comprising:
a masking circuit is configured to combine the search key with a mask template to generate a masked search key of a specific size; and
the exact match engine is configured to search an entry with which the masked search key matches exactly.

* * * * *